United States Patent
Kajiyama et al.

(10) Patent No.: US 7,816,264 B2
(45) Date of Patent: Oct. 19, 2010

(54) WAFER PROCESSING METHOD

(75) Inventors: Keiichi Kajiyama, Ota-Ku (JP);
Kazuhisa Arai, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/168,321

(22) Filed: Jul. 7, 2008

(65) Prior Publication Data

US 2009/0017623 A1 Jan. 15, 2009

(30) Foreign Application Priority Data

Jul. 13, 2007 (JP) .............................. 2007-183935

(51) Int. Cl.
*H01L 21/44* (2006.01)
(52) U.S. Cl. .................. 438/675; 438/667; 257/499; 257/500; 257/501; 257/502; 257/503; 257/504; 257/505; 257/506; 257/507; 257/508; 257/509; 257/510; 257/511; 257/512; 257/513; 257/514; 257/515; 257/516; 257/517; 257/518; 257/519
(58) Field of Classification Search .................. 438/667, 438/675; 257/E21.499–512
See application file for complete search history.

(56) References Cited

U.S. PATENT DOCUMENTS

| | | | | |
|---|---|---|---|---|
| 6,884,717 B1 * | 4/2005 | Desalvo et al. | ............... | 438/667 |
| 2005/0121768 A1 * | 6/2005 | Edelstein et al. | ............ | 257/698 |
| 2006/0292826 A1 * | 12/2006 | Kajiyama et al. | ........... | 438/459 |
| 2007/0048896 A1 * | 3/2007 | Andry et al. | ................. | 438/106 |
| 2008/0064187 A1 * | 3/2008 | Brown | ......................... | 438/464 |
| 2008/0265430 A1 * | 10/2008 | Ishihara | ...................... | 257/777 |

FOREIGN PATENT DOCUMENTS

| | | |
|---|---|---|
| JP | A 2003-17495 | 1/2003 |
| JP | A 2005-136187 | 5/2005 |
| WO | WO 2005/043622 * | 5/2005 |

* cited by examiner

*Primary Examiner*—Charles D Garber
*Assistant Examiner*—Yasser A Abdelaziez
(74) *Attorney, Agent, or Firm*—Greer, Burns & Crain, Ltd.

(57) ABSTRACT

A wafer processing method having a step of reducing the thickness of a wafer in only a device forming area where semiconductor chips are formed by grinding and etching the back side of the wafer to thereby form a recess on the back side of the wafer. At the same time, an annular projection is formed around the recess to thereby ensure the rigidity of the wafer. Accordingly, handling in shifting the wafer from the back side recess forming step to a subsequent step of forming a back side rewiring layer can be performed safely and easily.

2 Claims, 8 Drawing Sheets

WAFER PROCESSING METHOD

BACKGROUND OF THE INVENTION

1. Field of the Invention

The present invention relates to a method of processing a wafer to obtain a plurality of devices such as semiconductor chips having through metal electrodes, and more particularly to a technique of forming a rewiring layer on the back side of the wafer.

2. Description of the Related Art

In recent semiconductor device technologies, a semiconductor package having substantially the same size as that of a semiconductor chip called a CSP (Chip Size Package) is effectively used in achieving an increase in packaging density and a reduction in size and thickness. A conventional manufacturing method for such a semiconductor package includes the steps of stacking a semiconductor chip on a package substrate called an interposer, electrically connecting electrodes of the interposer and the semiconductor chip through gold wires by wire bonding, and molding the semiconductor chip and the interposer with resin. There is a case that a rewiring layer is formed on the front side of the semiconductor chip (the device element side). This rewiring layer is formed in the stage of a wafer as an aggregate of semiconductor chips, so that each semiconductor chip has the rewiring layer on the front side thereof.

In the case that the electrodes of the interposer and the semiconductor chip are connected by wire bonding, there is a possibility that the gold wires connecting the electrodes may be deformed in the resin molding step, causing a break or short circuit. In some case, the air remaining in the molding resin may be expanded in heating to cause damage to the semiconductor chip. To cope with this problem, there has been developed a technique of electrical connection such that through electrodes are provided in the semiconductor chip so as to extend through the thickness of the semiconductor chip and to be connected respectively to the electrodes of the semiconductor chip, wherein the electrodes of the semiconductor chip are connected through the through electrodes to the electrodes of the interposer at the same time the semiconductor chip is stacked on the interposer (see Japanese Patent Laid-open No. 2005-136187). Further, since the semiconductor chip is stacked on the interposer in the condition where the front side of the semiconductor chip is pressed toward the interposer, the rewiring layer formed on the front side of the semiconductor chip undergoes the pressure to cause damage such as collapse. To cope with this problem, there has been proposed a technique of forming a rewiring layer on the back side of a semiconductor chip rather than on the front side thereof to thereby reduce a load on the rewiring layer (see Japanese Patent Laid-open No. 2003-017495).

However, the thickness of each semiconductor chip is greatly reduced in the stage of the wafer for the purpose of reducing the size and thickness. Accordingly, handling in shifting the wafer from the thickness reducing step to a subsequent rewiring layer forming step or from the rewiring layer forming step to a subsequent wafer separating step becomes difficult. Further, cracking of the wafer occurs easily to cause a reduction in yield.

SUMMARY OF THE INVENTION

It is therefore an object of the present invention to provide a wafer processing method which can facilitate handling of a thin wafer to be separated into individual devices such as semiconductor chips each having a rewiring layer on the back side thereof, thereby attaining smooth shifting of the wafer between processing steps.

It is another object of the present invention to provide a wafer processing method which can make it possible to reliably form the rewiring layer on the back side of each device in the stage of the wafer, thereby improving the productivity and yield of the devices.

In accordance with an aspect of the present invention, there is provided a wafer processing method for forming a rewiring layer on the back side of a wafer having a substantially circular device forming area whose front side is formed with a plurality of devices and a remaining peripheral area surrounding the device forming area. The wafer processing method includes an electrode embedding step of embedding a plurality of metal electrodes in the device forming area at a depth greater than or equal to the thickness of each device from the upper surface of each device; a back side recess forming step of reducing the thickness of the device forming area from the back side of the wafer to form a recess on the back side of the wafer, thereby exposing the metal electrodes from the bottom surface of the recess and forming an annular projection in the remaining peripheral area so as to surround the recess; and a rewiring layer forming step of forming an insulating film on the bottom surface of the recess except an exposed portion of each metal electrode and next forming the rewiring layer on the insulating film.

Preferably, the back side recess forming step is performed by grinding and/or etching. That is, the formation of the recess on the back side of the wafer is performed by the combination of grinding and etching or by grinding only or etching only.

According to the present invention, the back side of the wafer in only the device forming area is removed to reduce the thickness of the wafer in the back side recess forming step, so that the remaining peripheral area of the wafer is not processed to form the annular projection having the original thickness of the wafer. Accordingly, although the thickness of the device forming area is reduced, the rigidity of the wafer can be ensured by the annular projection. Accordingly, handling in shifting the wafer from the back side recess forming step to the back side rewiring layer forming step can be performed safely and easily. Further, the back side rewiring layer forming step itself can be performed safely and easily. As a result, the back side rewiring layer can be reliably formed on the back side of each device in the stage of the wafer, and a reduction in yield due to cracking of the wafer can be prevented. Further, handling in shifting the wafer from the back side rewiring layer forming step to the subsequent step of separating the wafer to obtain the individual devices can be performed safely and easily, and this subsequent step itself can be performed safely and easily. As a result, the productivity and yield of the devices can be improved.

According to the present invention, the thickness of the wafer is reduced in only the device forming area to form the recess, and the remaining peripheral area is formed as the annular projection having the relatively large thickness, thereby ensuring the rigidity of the wafer. As a result, the rewiring layer can be reliably formed on the back side of the wafer, and the productivity and yield of the devices can be improved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the drawings.

[1] Semiconductor Wafer

Figure 1:
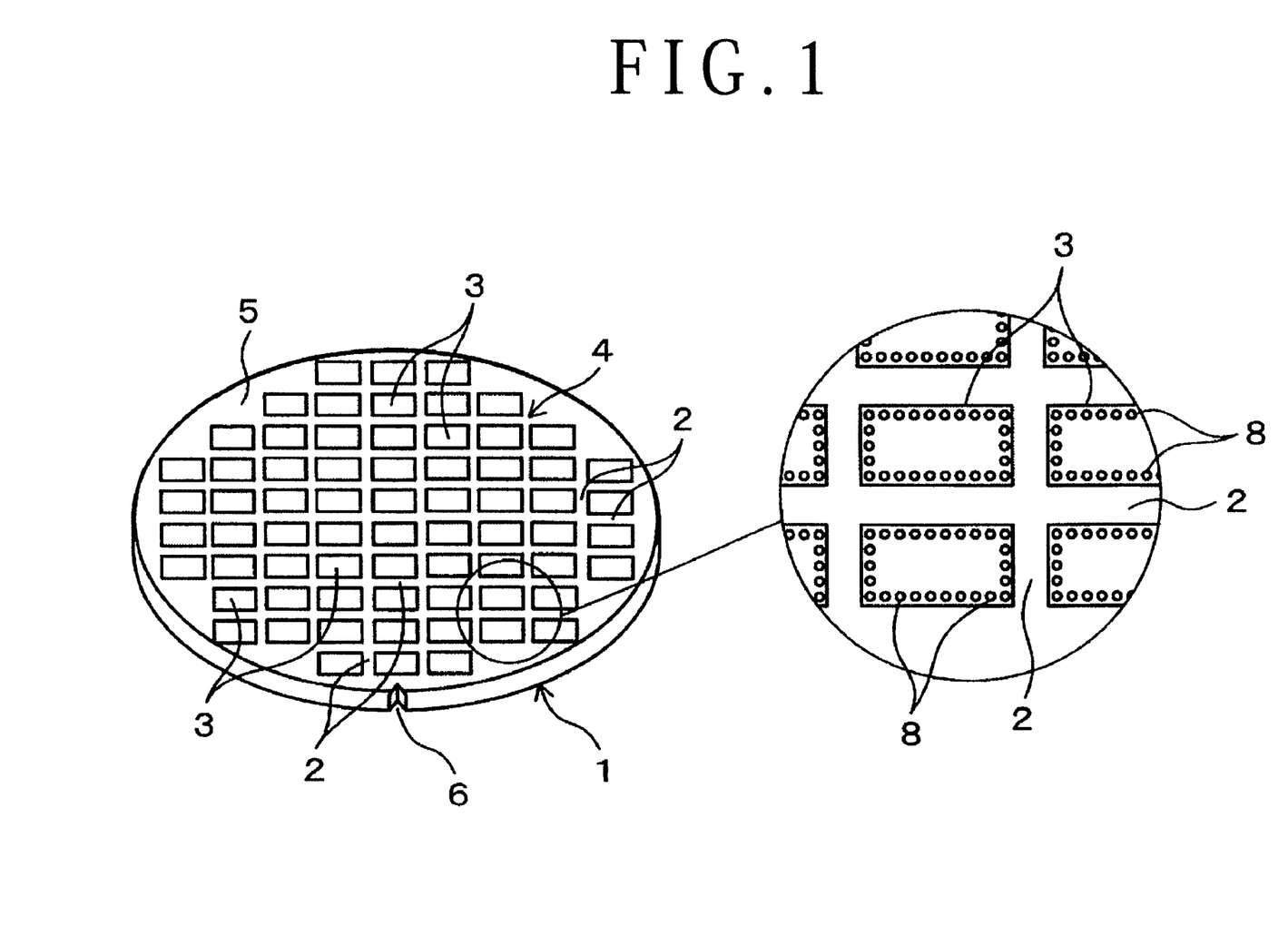
FIG. 1 is a perspective view of a wafer to be processed by a method according to a preferred embodiment of the present invention, wherein an encircled portion is enlarged to show the condition where metal electrodes are exposed to the front side of each semiconductor chip.

Reference numeral 1 shown in FIG. 1 denotes a disk-shaped semiconductor wafer as a substrate to be processed into semiconductor chips. The wafer 1 is a silicon wafer, for example, and the thickness of the wafer 1 is about 600 μm, for example. A plurality of crossing streets 2 are formed on the front side of the wafer 1 to thereby partition a plurality of rectangular semiconductor chips (devices) 3. An electronic circuit such as IC or LSI (not shown) is formed on the front side of each semiconductor chip 3.

These plural semiconductor chips 3 are formed in a generally circular device forming area 4 concentric with the wafer 1. The device forming area 4 occupies a large part of the wafer 1. The remaining peripheral portion of the wafer 1 around the device forming area 4 is formed as an annular remaining peripheral area 5 where the semiconductor chips 3 are not formed. Further, a V-shaped notch 6 for indicating the crystal orientation of a semiconductor is formed on the outer circumference of the wafer 1 at a predetermined position. The notch 6 is formed in the remaining peripheral area 5. As shown in an enlarged view encircled in FIG. 1, a plurality of metal electrodes 8 are embedded in each semiconductor chip 3 at predetermined positions so as to be exposed to the front side of the wafer 1. There will now be described a method including the steps of embedding the metal electrodes 8 in the wafer 1, reducing the thickness of the wafer 1 to expose the embedded end of each metal electrode 8 to the back side of the wafer 1, thereby forming through electrodes, and rewiring the through electrodes on the back side of the wafer 1.

[2] Metal Electrode Embedding Step

Figure 2A:
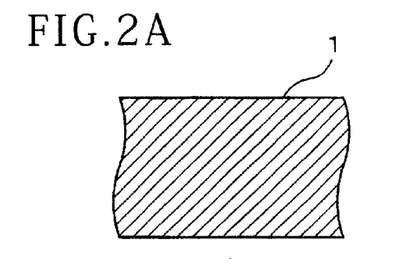
FIGS. 2A to 2H are sectional views showing the processing steps of the method according to the preferred embodiment.
Figure 2B:
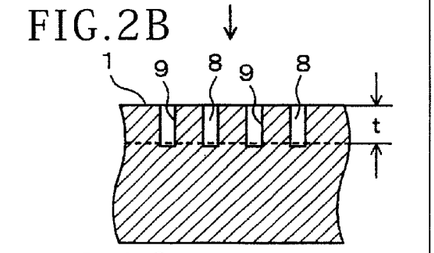

On the front side (upper surface) of each semiconductor chip 3 formed on the front side (upper surface) of the wafer 1 shown in FIG. 2A, the plural metal electrodes 8 are formed in such a manner that the upper end of each metal electrode 8 is substantially flush with the upper surface of the wafer 1 and the depth (length) of each metal electrode 8 is slightly larger than the thickness t of each semiconductor chip 3 as shown in FIG. 2B. More specifically, each metal electrode 8 is formed by forming a via hole 9 in the upper surface of the wafer 1, next forming an insulating film on the inner surface of the via hole 9, and finally filling the via hole 9 with an electrode metal such as copper. The via holes 9 in the wafer 1 may be formed by forming a resist pattern as a mask on the upper surface of the wafer 1 and next performing plasma etching to the upper surface of the wafer 1 or may be formed by irradiating the upper surface of the wafer 1 with laser beam. The metal electrodes 8 may be formed in the via holes 9 by a film deposition method such as CVD.

Figure 2C:
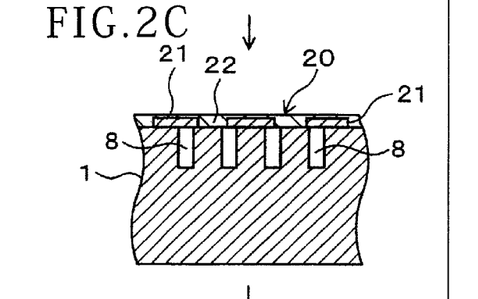

As shown in FIG. 2C, a front side rewiring layer 20 is formed on the upper surface of the wafer 1. The front side rewiring layer 20 is composed of metal wires 21 such as aluminum wires for connecting selected ones of the metal electrodes 8 and an insulating film 22 for covering the upper surface of the wafer 1 and the metal wires 21. The front side rewiring layer 20 is formed by first forming the metal wires 21 by a film deposition method such as CVD and next forming the insulating film 22. The material of the insulating film 22 may include an insulating resin such as polyimide and a glass oxide film such as SOG (Spin On Glass) and BPSG (Boron Phosphorous Silicate Glass). In the case of using such an insulating resin or SOG, the insulating film 22 is formed by a spin coat method such that a liquid material is dropped onto the center of the upper surface of the wafer 1 during rotation of the wafer 1 to thereby centrifugally spread the liquid material over the upper surface of the wafer 1. In the case of using BPSG, the insulating film 22 is formed by a film deposition method such as CVD. The thickness of the insulating film 22 is set to about 5 to 10 μm, for example.

[3] Protective Tape Attaching Step

Figure 3A:
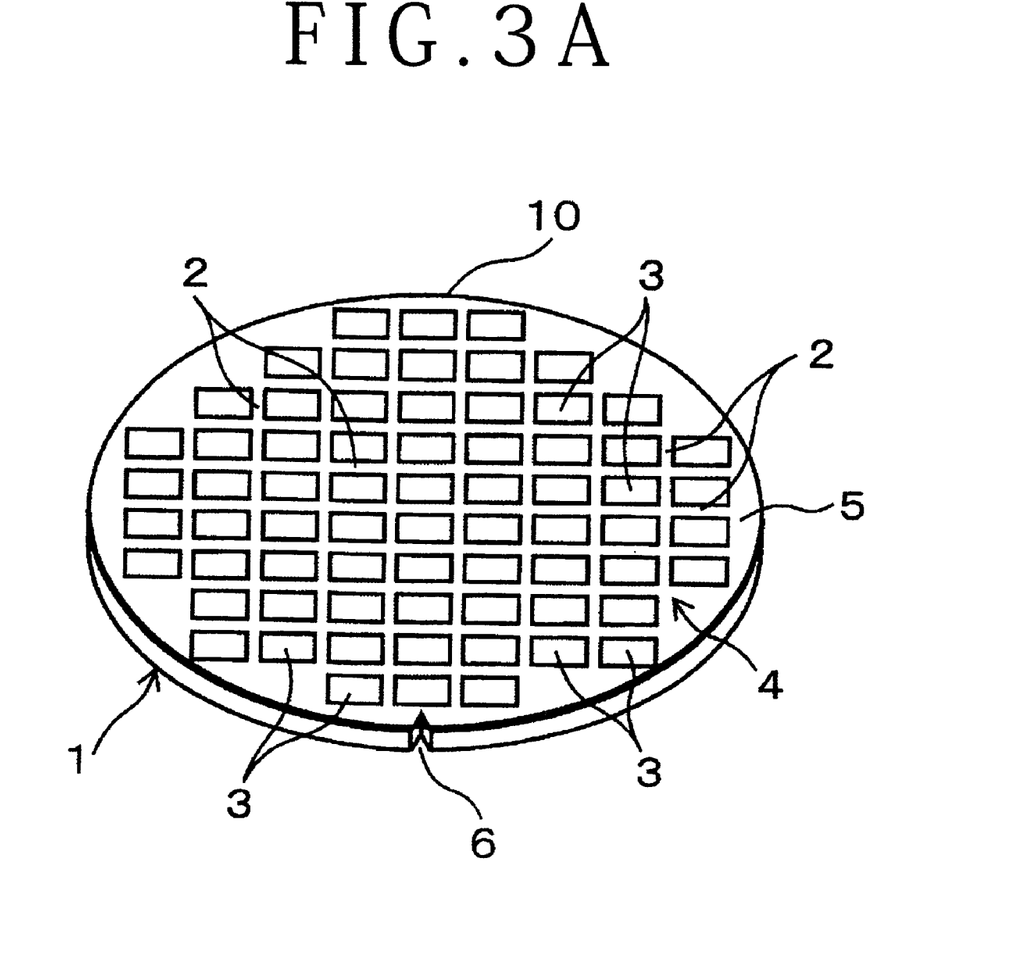
FIG. 3A is a perspective view of the wafer in the condition where a protective tape is attached to the front side of the wafer in a protective tape attaching step.
Figure 3B:
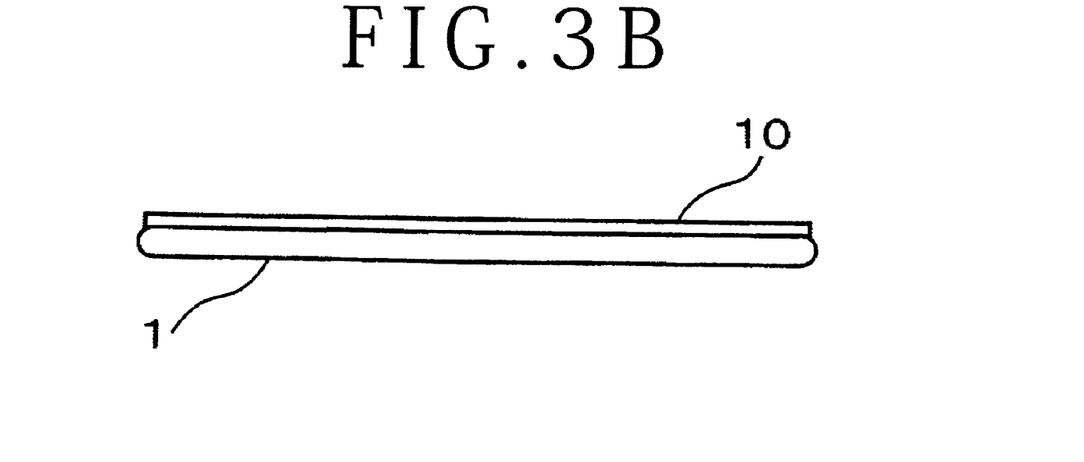
FIG. 3B is a side view of the wafer shown in FIG. 3A.

After forming the front side rewiring layer 20 on the front side of the wafer 1, the back side of the wafer 1 is removed to obtain a desired thickness of the wafer 1 corresponding to the thickness of each semiconductor chip 3 to be manufactured. Prior to performing such a thickness reducing step, a protective tape 10 is attached to the front side (upper surface) of the wafer 1 as shown in FIGS. 3A and 3B. The protective tape 10 is preferably composed of a base sheet of polyethylene or the like and an adhesive such as an acrylic adhesive coated on one side of the base sheet. For example, the base sheet has a thickness of about 100 to 200 μm, and the adhesive has a thickness of about 10 to 20 μm. The purpose of attaching the protective tape 10 is to prevent damage to the electronic circuits in the semiconductor chips 3 and the front side rewiring layer 20 formed on the front side of the wafer 1 in the next back side recess forming step.

[4] Back Side Recess Forming Step

Figure 6A:
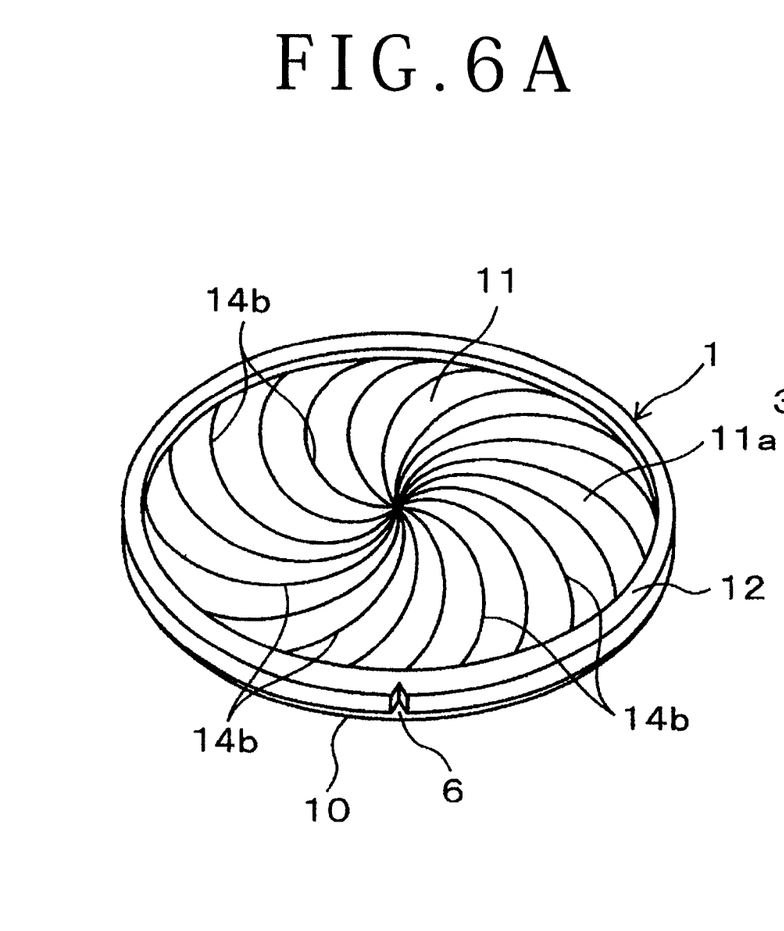
FIG. 6A is a perspective view showing the back side of the wafer formed with a recess after finish grinding.
Figure 6B:
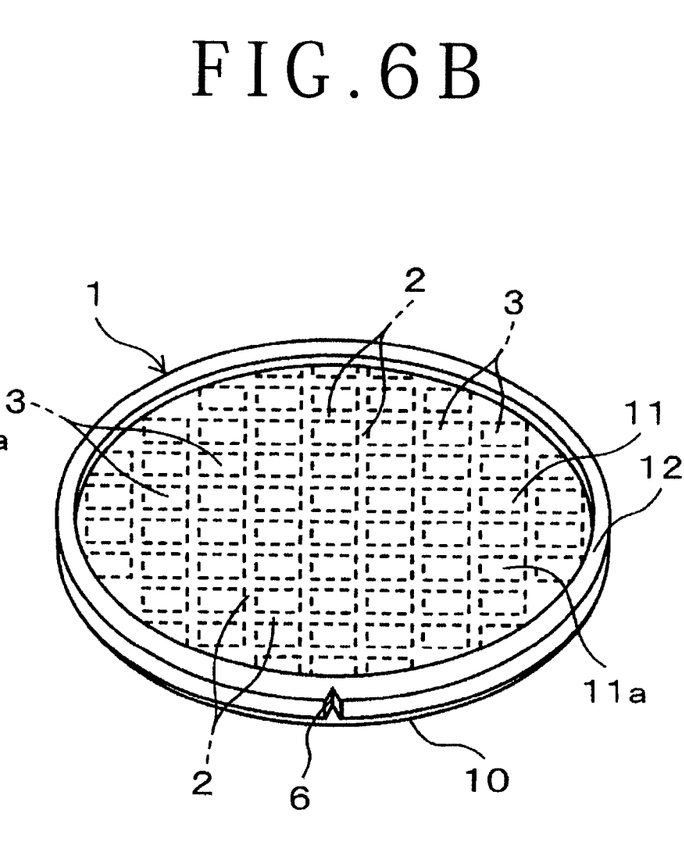
FIG. 6B is a perspective view similar to FIG. 6A, showing a condition after etching.

In the reduction in thickness of the wafer 1 according to this preferred embodiment, the predetermined thickness of all area of the back side of the wafer 1 is not removed, but the predetermined thickness of only a part of the back side corresponding to the device forming area 4 is removed. Accordingly, as shown in FIGS. 6A and 6B, a recess 11 is formed on the back side of the wafer 1 in the device forming area 4, and an annular projection 12 is resultantly formed in the remaining peripheral area 5 so as to surround the recess 11. In other words, the back side of the wafer 1 is removed to form the recess 11 with the outer circumferential portion being left as the annular projection 12. In this preferred embodiment, the recess 11 is formed mainly by grinding the back side of the wafer 1, and a slightly remaining thickness is removed by etching after performing this grinding.

Figure 2D:
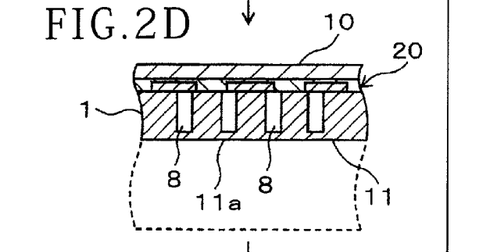
Figure 2E:
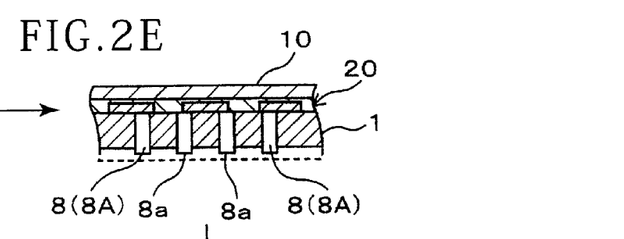

As shown in FIG. 2D, the amount of grinding of the back side of the wafer 1 is set so that the lower end of each metal electrode 8 (one end of the back side of the wafer 1) is not exposed to the back side of the wafer 1, i.e., a slight thickness is left between the lower end of each metal electrode 8 and the bottom surface 11a of the recess 11. Thus, in the stage of finishing the grinding, the lower end of each metal electrode 8 is not exposed to the back side (lower surface) of the wafer 1. Thereafter, as shown in FIG. 2E, the bottom surface 11a of the recess 11 is etched to slightly project the lower end of each metal electrode 8 from the bottom surface 11a. As a result, each metal electrode 8 becomes a through electrode 8A extending through the thickness of the wafer 1. The amount of projection of each through electrode 8A from the bottom surface 11a is set to about 5 µm, for example. Such a projecting portion of each through electrode 8A is provided as a back side electrode portion 8a.

[4-1] Back Side Grinding

Figure 4:
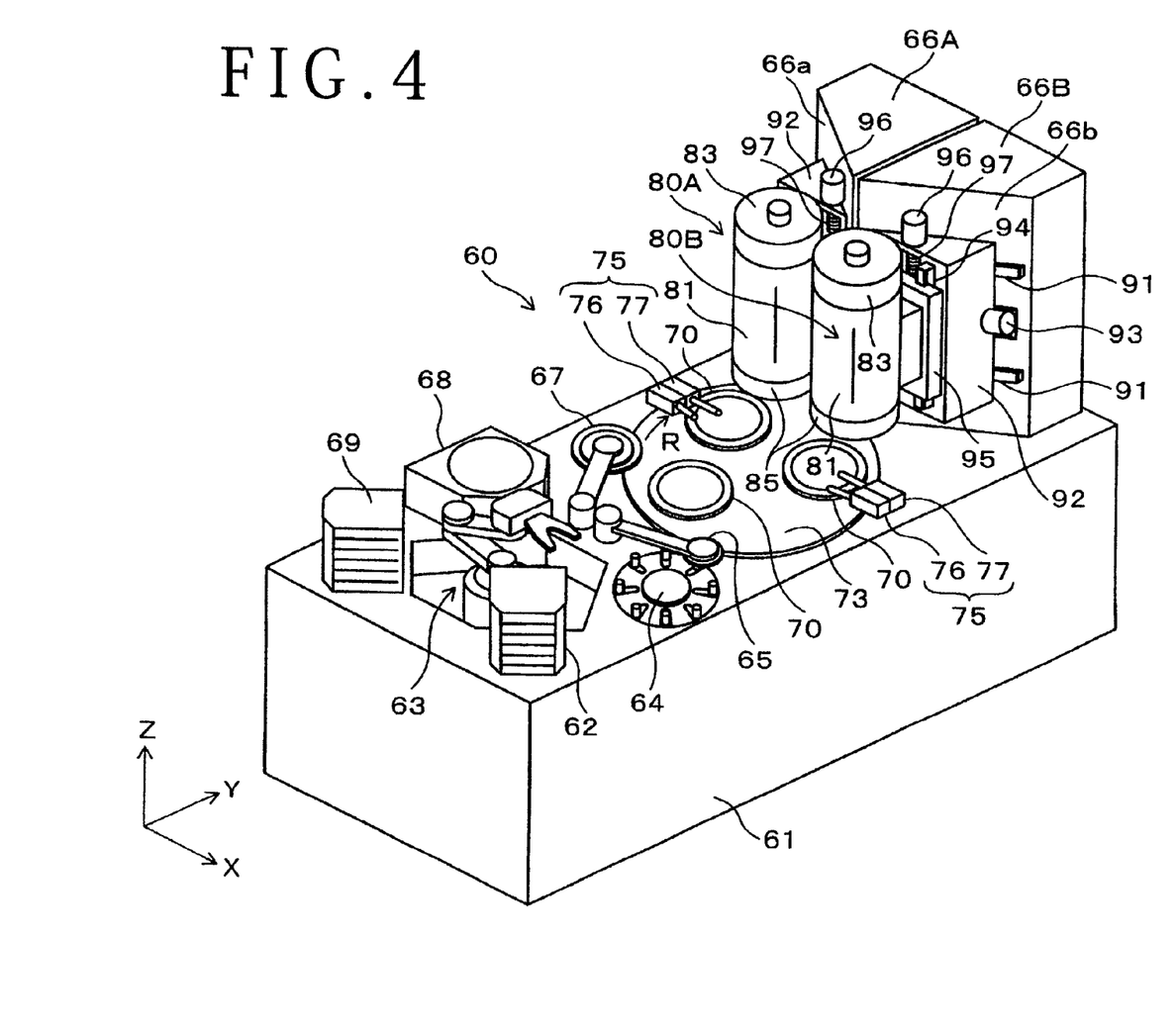
FIG. 4 is a perspective view of a grinding apparatus used in a back side recess forming step.

Only regions of the back side of the wafer 1 corresponding to the device forming area 4 is ground to form the recess 11 preferably by infeed grinding using a grinding apparatus 60 shown in FIG. 4. According to this grinding apparatus 60, the front side of the wafer 1 formed with the front side rewiring layer 20 is placed on a suction surface of a vacuum chuck type chuck table 70 to thereby hold the wafer 1 on the chuck table 70, and the back side of the wafer 1 is next subjected to rough grinding and finish grinding in this order by means of two grinding units 80A and 80B respectively for rough grinding and finish grinding.

The configuration and operation of the grinding apparatus 60 will now be described with reference to FIG. 4. The grinding apparatus 60 includes a rectangular parallelepiped base 61. A supply cassette 62 for storing a plurality of wafers 1 is detachably set on the base 61 at a predetermined position. The plurality of wafers 1 are stacked in the supply cassette 62 in the condition where the front side of each wafer 1 is directed upward. One of the plural wafers 1 is drawn out of the supply cassette 62 by a pickup robot 63. The wafer 1 thus drawn out of the supply cassette 62 is turned upside down by the pickup robot 63 and then placed on a positioning table 64 in the condition where the back side of the wafer 1 is directed upward. Thus, the wafer 1 is positioned on the positioning table 64.

A turn table 73 is provided on the base 61 so as to be rotatably driven in the direction shown by an arrow R, and a plurality of (three in this preferred embodiment) disk-shaped chuck tables 70 are provided on the turn table 73 in its peripheral portion so as to be arranged at equal intervals in the circumferential direction of the turn table 73. Each chuck table 70 has a rotation axis extending in the direction shown by an arrow Z (in the vertical direction), and is rotatably supported to the turn table 73. Each chuck table 70 is rotationally driven by a rotational driving mechanism (not shown).

Figure 5A:
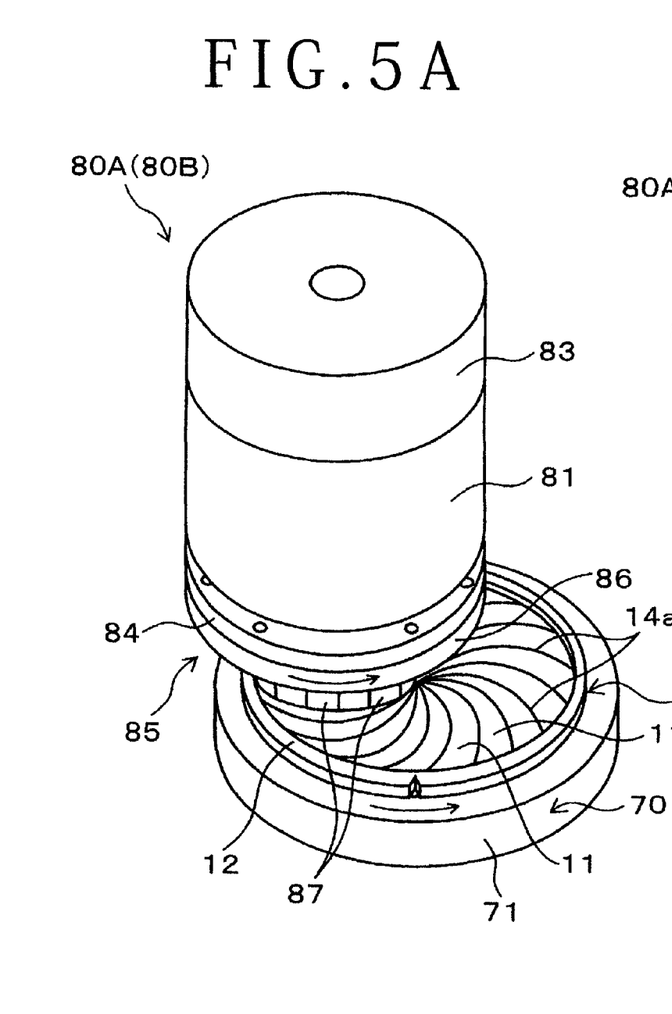
FIG. 5A is a perspective view showing a grinding unit in the grinding apparatus shown in FIG. 4.
Figure 5B:
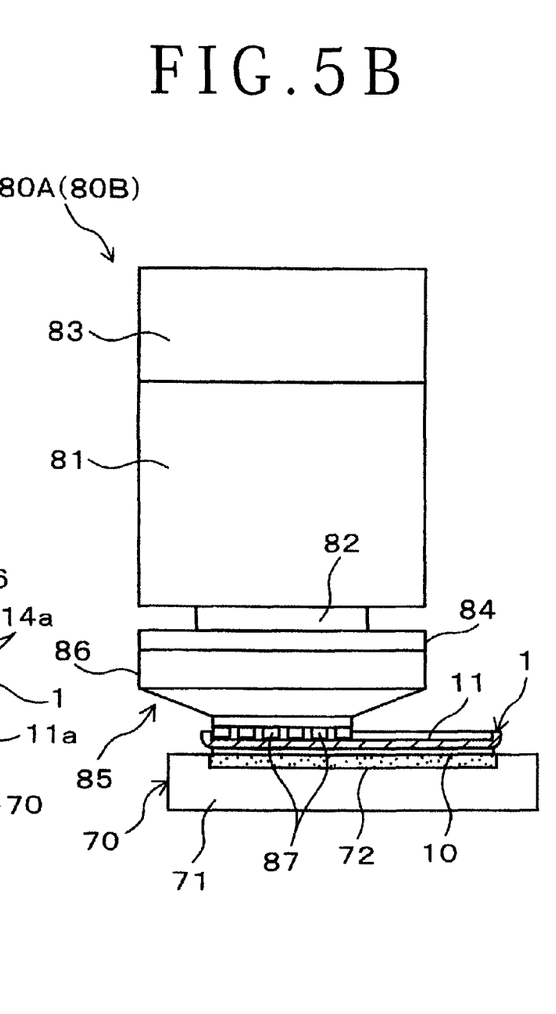
FIG. 5B is a side view of the grinding unit shown in FIG. 5A.

The wafer 1 positioned on the positioning table 64 is lifted by a supply arm 65 and is next concentrically placed on the chuck table 70 waiting at a mount/demount position under suction vacuum in such a manner that the front side of the wafer 1 to which the protective tape 10 is attached is directed downward. As shown in FIGS. 5A and 5B, each chuck table 70 includes a disk-shaped body 71. A circular porous suction member 72 is formed on the upper surface of the body 71 at its central portion. The wafer 1 is held on the upper surface of the suction member 72 of the chuck table 70 in the condition where the protective tape 10 attached to the front side of the wafer 1 is kept in close contact with the upper surface of the suction member 72 and the back side of the wafer 1 is exposed. Accordingly, the electronic circuits in the semiconductor chips 3 and the front side rewiring layer 20 formed on the front side of the wafer 1 can be protected by the protective tape 10 from any damage during grinding.

When the turn table 73 is rotated in the direction R at a predetermined angle, the wafer 1 held on the chuck table 70 is moved to a primary grinding position directly below the rough grinding unit 80A. At the primary grinding position, the back side of the wafer 1 is subjected to rough grinding by the grinding unit 80A. Thereafter, by the rotation of the turn table 73 in the direction R at a predetermined angle, the wafer 1 is moved to a secondary grinding position directly below the finish grinding unit 80B. At the secondary grinding position, the back side of the wafer 1 is subjected to finish grinding by the grinding unit 80B.

A pair of columns 66A and 66B stand on the base 61 at its rear end portion as viewed in FIG. 4 so as to be arranged adjacent to each other in the direction shown by an arrow X. The grinding units 80A and 80B are mounted on the front surfaces of the columns 66A and 66B, respectively. The mounting structures of the grinding units 80A and 80B to the respective columns 66A and 66B are the same and they are symmetrical in the X direction. Accordingly, the mounting structure of the grinding unit 80B to the column 66B for finish grinding will now be described with reference to FIG. 4.

The column 66B for finish grinding has a tapered front surface 66b perpendicular to the upper surface of the base 61 and inclined with respect to the X direction in such a manner that the right side of the tapered front surface 66b is retracted from the left side thereof as viewed in FIG. 4 to form a predetermined tapering angle of the tapered surface 66b with respect to the X direction. The tapered surface 66b (the tapered surface 66a in the case of the column 66A on the rough grinding side) has a tapering direction parallel to the line connecting the center of rotation of the chuck table 70 set at the primary grinding position and the center of rotation of the turn table 73.

A pair of upper and lower guides 91 is provided on the tapered surface 66b (66a) so as to extend parallel to the tapering direction of the tapered surface 66b (66a). An X-axis slider 92 is slidably mounted on these guides 91. The X-axis slider 92 is reciprocated along the guides 91 by a ball screw type feeding mechanism (not shown) driven by a servo motor 93. The reciprocating direction of the X-axis slider 92 is parallel to the direction of extension of each guide 91, i.e., the tapering direction of the tapered surface 66b (66a).

The X-axis slider 92 has a front surface parallel to X and Z directions. The grinding units 80A, 80B are mounted on the front surface of the X-axis slider 92 so as to be movable in the Z direction (vertical direction). A pair of right and left guides 94 (only the right one being shown) are provided on the front surface of the X-axis slider 92 so as to extend in the Z direction, and the grinding units 80A, 80B is slidably mounted on the guides 94 through a Z-axis slider 95. The grinding units 80A, 80B is movable with the Z-axis slider 95 in the Z direction by a ball screw type feeding mechanism 97 driven by a servo motor 96.

The grinding units 80A and 80B have the same configuration except that the grindstones included therein are different between rough grinding and finish grinding. As shown in FIGS. 5A and 5B, each of the grinding units 80A and 80B includes a cylindrical spindle housing 81 having an axis extending in the Z direction, a spindle shaft 82 coaxially and rotatably supported in the spindle housing 81, a motor 83 coaxially fixed to the upper end of the spindle housing 81 for rotationally driving the spindle shaft 82, and a disk-shaped flange 84 coaxially fixed to the lower end of the spindle shaft 82. A grinding wheel 85 is mounted on the lower surface of the flange 84.

The grinding wheel 85 is composed of an annular frame 86 having a conical lower surface and a plurality of grindstone 87 fixed to the lower surface of the annular frame 86 so as to be spaced in the circumferential direction of the annular frame 86. The lower end surface of each grindstone 87 as a cutting edge is orthogonal to the axial direction of the spindle shaft 82. For example, each grindstone 87 is produced by mixing diamond abrasive grains in a vitreous bond, forming the resultant mixture, and sintering the formed mixture.

Each grindstone 87 of the rough grinding unit 80A contains relatively coarse abrasive grains having a grain size of about #320 to #400, whereas each grindstone 87 of the finish grinding unit 80B contains relatively fine abrasive grains having a grain size of about #2000 to #8000. Although not shown, each of the grinding units 80A and 80B is provided with a grinding water supplying mechanism for supplying grinding water for cooling and lubrication of a subject surface to be ground or for removal of dust due to grinding.

The grinding outer diameter of the grinding wheel 85, i.e., the outer diameter of the ring formed by the grindstone 87 is set slightly smaller than the radius of the wafer 1 and substantially equal to the radius of the device forming area 4. With this setting, the cutting edge of each grindstone 87 passes through the center of rotation of the wafer 1 concentrically held on the rotating chuck table 70, and the outer circumferential edge of the cutting edge passes through the outer circumferential edge of the device forming area 4 (the boundary between the device forming area 4 and the remaining peripheral area 5), so as to grind only the region of the back side of the wafer 1 corresponding to the device forming area 4, whereby the recess 11 shown in FIG. 6 can be formed.

As described above, the direction of the line connecting the center of rotation of the chuck table 70 set at the primary and second grinding position and the center of rotation of the turn table 73 extends parallel to the tapering direction of the tapered surfaces 66*a*, 66*b* of the columns 66A, 66B, i.e., the direction of extension of guides 91 provided on the tapered surfaces 66*a*, 66*b*. Each of these lines will be hereinafter referred to as a center connection line. In each of the grinding units 80A and 80B, the center of rotation of the grinding wheel 85 (the axis of the spindle shaft 82) is positioned so as to intersect the center connection line mentioned above. More specifically, the center of rotation of the grinding wheel 85 of the rough grinding unit 80A intersects the center connection line between the chuck table 70 set at the primary grinding position and the turn table 73. Similarly, the center of rotation of the grinding wheel 85 of the finish grinding unit 80B intersects the center connection line between the chuck table 70 set at the secondary grinding position and the turn table 73. Accordingly, when the grinding units 80A and 80B are moved with the respective X-axis sliders 92 along the respective guides 91, the center of rotation of each grinding wheel 85 is moved along the corresponding center connection line.

The back side of the wafer 1 is first ground at the primary grinding position by the rough grinding unit 80A and next ground at the secondary grinding position by the finish grinding unit 80B. In performing the back grinding of the wafer 1, the position of the grinding unit 80A (80B) along the center connection line is adjusted by moving the X-axis slider 92 to thereby set the grinding wheel 85 to a recess forming position where the grinding outer diameter of the grinding wheel 85 facing the back side of the wafer 1 comes into coincidence with the radius of the device forming area 4 of the wafer 1. At this recess forming position, the cutting edge of each grindstone 87 passes through the center of rotation of the wafer 1 and the outer circumferential edge of the device forming area 4. More specifically, the recess forming position is set between the center of rotation of the wafer 1 and the outer circumference of the turn table 73. After setting the grinding wheel 85 at this recess forming position, the chuck table 70 holding the wafer 1 is rotated to thereby rotate the wafer 1 about its center of rotation, and the feeding mechanism 97 is driven to lower the grinding unit 80A (80B), thereby bringing the grindstone 87 of the rotating grinding wheel 85 into pressure contact with the back side of the wafer 1 at the recess forming position. The rotational speed of the grinding wheel 85 is set to about 2000 to 5000 rpm.

In performing the rough grinding by the rough grinding unit 80A, the back side of the wafer 1 in only the device forming area 4 is ground to form the recess 11 as shown in FIGS. 5A and 5B. As the result, the annular projection 12 is left around the recess 11, so that the thickness of the annular projection 12 is the same as that of the remaining peripheral area 5 of the wafer 1. In this rough grinding, the thickness of the device forming area 4 is reduced to a value obtained by adding about 20 to 40 μm to a desired thickness which will be obtained by the subsequent finish grinding. That is, the remaining thickness of about 20 to 40 μm is removed by the finish grinding to obtain the desired thickness of the wafer 1 in the device forming area 4.

As shown in FIG. 5A, a grinding streak 14*a* having such a pattern that many arcs radially extend from the center of the wafer 1 is left on the bottom surface 11*a* of the recess 11 after the rough grinding. This grinding streak 14*a* is caused by crumbling by the abrasive grains contained in each grindstone 87, and it is a mechanical damage layer including microcracks. The grinding streak 14*a* due to the rough grinding is removed by the finish grinding, but a new grinding streak 14*b* is left on the bottom surface 11*a* of the recess 11 after the finish grinding as shown in FIG. 6A.

A thickness measuring gauge 75 is provided in the vicinity of the primary grinding position for rough grinding, and another thickness measuring gauge 75 is provided in the vicinity of the secondary grinding position for finish grinding. Each thickness measuring gauge 75 measures the thickness of the wafer 1 and controls the grinding amount according to measured value during the back grinding of the wafer 1. Each thickness measuring gauge 75 is composed of a reference height gauge 76 having a probe coming into contact with the upper surface of the body 71 of the chuck table 70 and a variable height gauge 77 having a probe coming into contact with the subject surface to be ground (i.e., the bottom surface 11*a* of the recess 11 of the wafer 1). By comparing the measured values for the height obtained from the reference height gauge 76 and the variable height gauge 77, the thickness of the wafer 1 during the back grinding is sequentially measured. Thus, the back grinding of the wafer 1 is performed as measuring the thickness of the wafer 1 by using each thickness measuring gauge 75 and controlling the amount of feed of the grinding wheel 85 fed by the corresponding feeding mechanism 97 according to the measured value from the corresponding gauge 75.

After completing the finish grinding to obtain the desired thickness of the device forming area 4 of the wafer 1, the wafer 1 is recovered in the following manner. First, the finish grinding unit 80B is lifted and retracted from the wafer 1, and the turn table 73 is rotated in the direction R at a predetermined angle to thereby return the wafer 1 to the mount/demount position. At this position, the vacuum operation of the chuck table 70 is stopped and the wafer 1 is transported from the chuck table 70 to a spinner type cleaning unit 68 by a recovery arm 67. In the cleaning unit 68, the wafer 1 is cleaned and dried. Thereafter, the wafer 1 is recovered into a recovery cassette 69 by the pickup robot 63.

[4-2] Back Side Etching

After forming the recess 11 on the back side of the wafer 1 to reduce the thickness of only the device forming area 4, the bottom surface 11a of the recess 11 is etched to remove a slight thickness. Accordingly, as shown in FIG. 2E, each metal electrode 8 projects from the back side of the wafer 1, thereby forming each through electrode 8A and each back side electrode portion 8a. As an etching method for the wafer 1, plasma etching is preferably adopted, using an etching gas reacting with the wafer material such as silicon, but not reacting with the metal electrodes 8 (through electrodes 8A).

The plasma etching is performed by filling a reactor containing the wafer 1 with a silicon etching gas (e.g., fluorine-based gas such as CF4 and SF6) known in the art and producing a plasma discharge in the reactor. If the protective tape 10 has sufficient heat resistance, the protective tape 10 may be kept attached to the front side of the wafer 1 in performing the plasma etching. However, if the heat resistance of the protective tape 10 is insufficient, the protective tape 10 is peeled off before performing the plasma etching.

Figure 7:
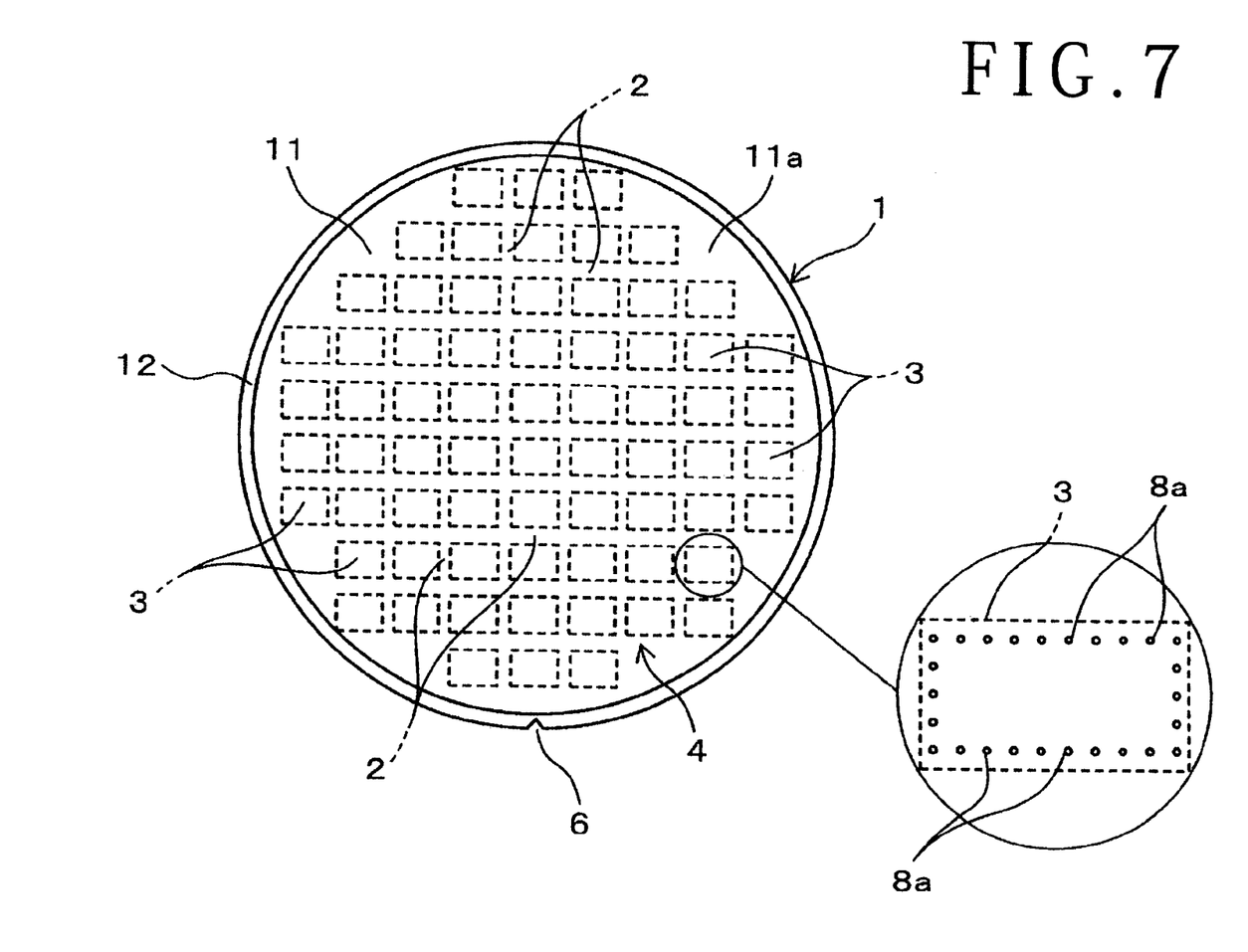
FIG. 7 is a plan view showing the back side of the wafer in the condition where the recess is etched, wherein an encircled portion is enlarged to show the condition where through electrodes (back side electrode portions) are exposed to the front side of each semiconductor chip.

By the etching to the recess 11, the through electrodes 8A project from the bottom surface 11a of the recess 11 of the wafer 1 to form the back side electrode portions 8a as shown in FIGS. 2E and 7. At the same time, the mechanical damage layer having the grinding streak 14b left on the back side of the wafer 1 even after the finish grinding can be eliminated by this etching process as shown in FIG. 6B. Such a mechanical damage layer may cause stress concentration, which in turn causes cracks or breakage. However, since the mechanical damage layer is eliminated from the wafer 1 by the etching according to this preferred embodiment, the strength of the wafer 1 or each semiconductor chip 3 can be improved. While plasma etching is adopted as the etching for projecting the metal electrodes 8 from the back side of the wafer 1 and removing the grinding streak 14b from the bottom surface 11a of the recess 11 in this preferred embodiment, wet etching known in the art may be adopted.

[5] Back Side Rewiring Layer Forming Step

[5-1] Formation of Back Side Insulating Film

Figure 2F:
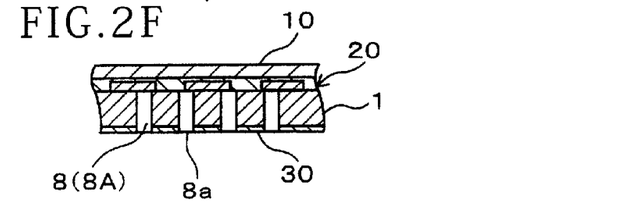

A step of forming a rewiring layer on the back side of the wafer 1 is next performed. As shown in FIG. 2F, a back side insulating film 30 is first formed on the bottom surface 11a of the recess 11. The back side insulating film 30 may be formed by using a material and method similar to those used for the insulating film 22 of the front side rewiring layer 20. The back side insulating film 30 has such a thickness that the bottom surface 11a of the recess 11 is entirely covered with the insulating film 30 in the condition where at least the end surface of each back side electrode portion 8a is exposed. Accordingly, the thickness of the back side insulating film 30 is set to about 5 to 10 μm corresponding to the height of each back side electrode portion 8a.

[5-2] Lamination of Back Side Rewiring Layers

Figure 2G:
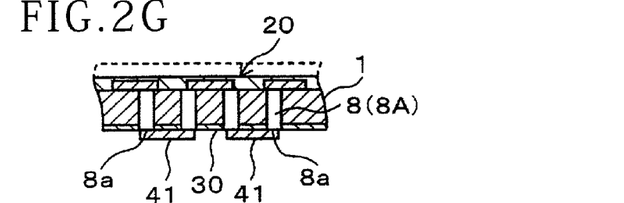

After forming the back side insulating film 30, a first back side rewiring layer 40 is formed on the back side insulating film 30 in a manner similar to that of formation of the front side rewiring layer 20. As shown in FIG. 2G, selected ones of the back side electrode portions 8a are connected by wires 41.

Figure 2H:
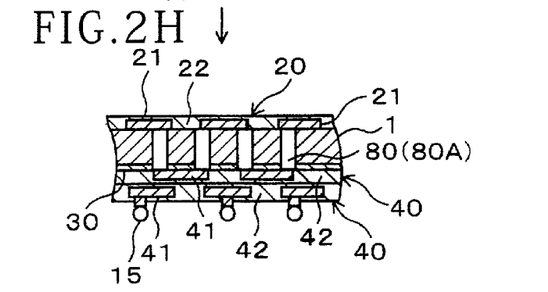

Thereafter, as shown in FIG. 2H, an insulating film 42 is formed so as to cover the wires 41 and the back side insulating film 30. Thereafter, a second back side rewiring layer 40 composed of wires 41 and an insulating film 42 is similarly formed on the first back side rewiring layer 40 as shown in FIG. 2H. While the two back side rewiring layers 40 are formed in this preferred embodiment, a single back side rewiring layer may be formed or three or more back side rewiring layers may be formed as required.

[6] Bump Forming Step

After forming the back side rewiring layer 40, as shown in FIG. 2H, a plurality of bumps 15 are formed so as to be connected to the wires 41 of the second back side rewiring layer 40 and to project from the bottom surface 11a of the recess 11. Each bump 15 is formed by thermocompression-bonding a solder ball, for example.

[7] Semiconductor Chip

Thus, the processing to the wafer 1 prior to separation into the semiconductor chips 3 is completed. Thereafter, the protective tape 10 is peeled off from the wafer 1, and the wafer 1 is cut along all the streets 2 by any means such as dicing or laser cutting, thereby obtaining all the individual semiconductor chips 3. For example, the wafer 1 is separated into the individual semiconductor chips 3 by a method including the steps of holding the wafer 1 by using any holding means such as a chuck table in the condition where the protective tape 10 attached to the front side of the wafer 1 comes into contact with the holding means and the recess 11 formed on the back side of the wafer 1 is exposed, next recognizing the streets 2 from the back side of the wafer 1 by means of an infrared microscope or the like, and then cutting the wafer 1 along the streets 2 from the back side of the wafer 1 by dicing or irradiation with laser light. According to this method, the flat front side of the wafer 1 is held by the holding means, so that a conventional holding structure for the wafer 1 by the holding means can be maintained and the wafer 1 can be held more easily as compared with the case that the back side of the wafer 1 formed with the recess 11 is held by the holding means. Each semiconductor chip 3 may be stacked on an interposer or the other semiconductor chip 3 to thereby manufacture a layered semiconductor package.

Figure 8:
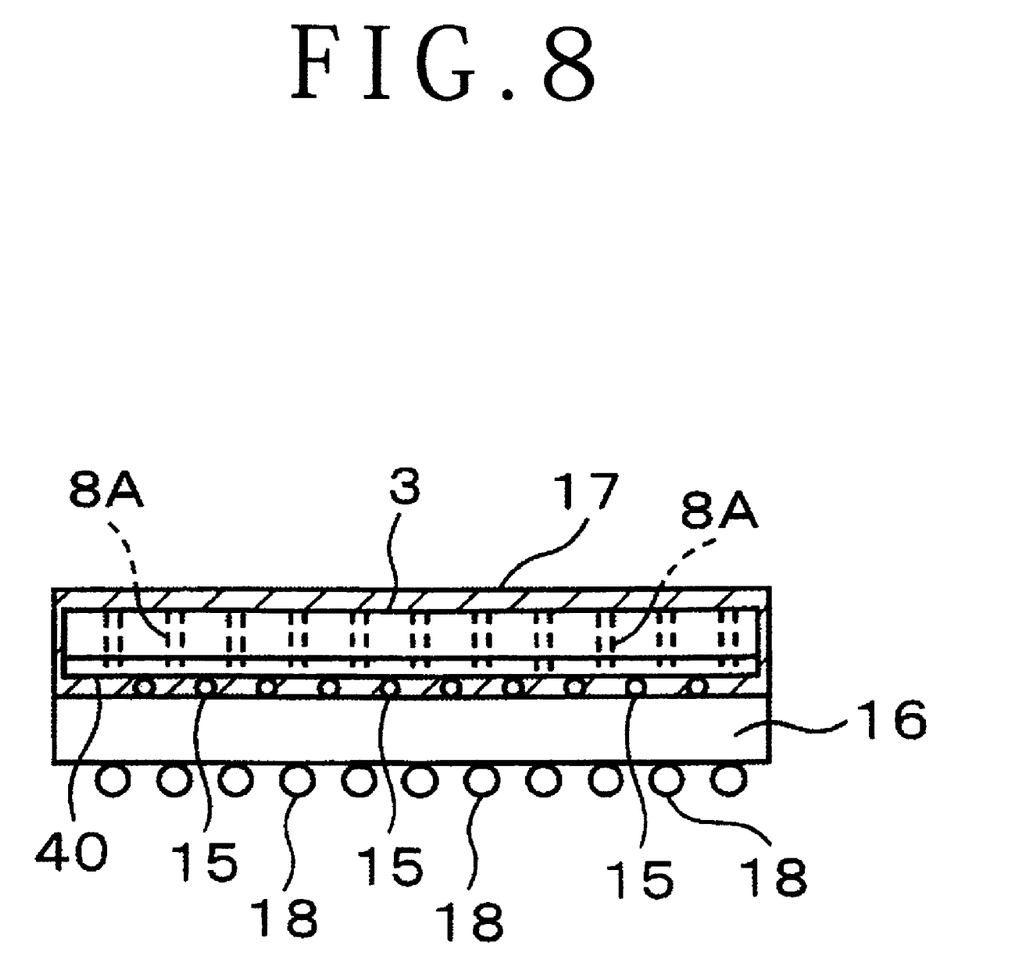
FIG. 8 is a sectional view showing a semiconductor package formed by stacking a semiconductor chip on an interposer.

FIG. 8 shows an example of such a layered semiconductor package. That is, one of the semiconductor chips 3 separated from the wafer 1 is stacked on an interposer 16 and molded with resin 17. Through electrodes are embedded in the interposer 16, and the bumps 15 are thermocompression-bonded to the through electrodes of the interposer 16 by applying ultrasonic vibrations, thereby attaining electrical connection and fixation of the layered condition between the semiconductor chip 3 and the interposer 16. A plurality of bumps 18 as electrical contacts to a substrate (not shown) are formed on the back side of the interposer 16.

[8] Operation and Effect of the Preferred Embodiment

According to the wafer processing method in this preferred embodiment, the back side of the wafer 1 in only the device forming area 4 is removed to reduce the thickness of the wafer 1 in the back side recess forming step, so that the remaining peripheral area 5 of the wafer 1 is not processed to form the annular projection 12 having the original thickness of the wafer 1. Accordingly, although the thickness of the device forming area 4 is reduced, the rigidity of the wafer 1 can be ensured by the annular projection 12. Accordingly, handling in shifting the wafer 1 from the back side recess forming step to the back side rewiring layer forming step can be performed safely and easily. Further, the back side rewiring layer forming step itself can be performed safely and easily. As a result, the back side rewiring layer 40 can be reliably formed on the back side of each semiconductor chip 3 in the stage of the wafer 1, and a reduction in yield due to cracking of the wafer 1 can be prevented.

Further, handling in shifting the wafer 1 from the back side rewiring layer forming step to the subsequent step of separating the wafer 1 to obtain the individual semiconductor chips 3 can be performed safely and easily, and this subsequent step itself can be performed safely and easily. As a result, the productivity and yield of the semiconductor chips 3 can be improved.

In the above preferred embodiment, the formation of the recess 11 on the back side of the wafer 1 is performed by the combination of grinding by the grinding apparatus 60 and etching, wherein most of the depth of the recess 11 is first formed by grinding and a slight thickness is next removed from the bottom surface 11a of the recess 11 by etching to thereby project the back side electrode portions 8a from the bottom surface 11a. As a modification, the formation of the recess 11 on the back side of the wafer 1 may be performed by grinding only or by etching only.

In the case of forming the recess 11 by grinding only, the lower end surface of each through electrode 8A can be made flush with the bottom surface 11a of the recess 11. However, since the subject surface to be ground is flat, the back side electrode portions 8a projecting from the bottom surface 11a cannot be formed. Accordingly, in this case, the back side insulating film 30 is formed on the bottom surface 11a except the lower end surface of each through electrode 8A exposed to the bottom surface 11a, and a resultant hole to which the lower end surface of each through electrode 8A is exposed is next filled with the metal forming each back side electrode portion 8a by a deposition method such as CVD, evaporation, sputtering, or plating, thus forming the back side electrode portions 8a respectively connected to the through electrodes 8A.

In the case of forming the recess 11 by etching only, both the wafer 1 and the metal electrodes 8 are etched off by using an etching gas or etching liquid such that the etch rate for the wafer 1 is higher than that for the metal electrodes 8 to thereby project the back side electrode portions 8a from the bottom surface 11a of the recess 11. Alternatively, the recess 11 may be formed so as to project the back side electrode portions 8a by a method including the steps of using a first etchant having the same etch rate for the wafer 1 and the metal electrodes 8 to thereby form most of the depth of the recess 11 and next using a second etchant having a higher etch rate for the wafer 1 to etch only the wafer 1 by several micrometers.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for forming a rewiring layer on a back side of a wafer having a substantially circular device forming area whose front side is formed with a plurality of devices and a remaining peripheral area surrounding said device forming area, said wafer processing method comprising:
   a via hole forming step of forming a plurality of via holes in the devices in said device forming area from the front side of said wafer;
   an insulating film forming step of forming an insulation film on an inner surface of said via holes;
   an electrode embedding step of embedding a plurality of metal electrodes in said via holes to a depth greater than or equal to the thickness of each device from the front side of said wafer;
   a back side recess forming step of reducing the thickness of said device forming area by grinding the back side of said wafer following the electrode embedding step to form a first recess on the back side of said wafer, and an annular projection in said remaining peripheral area so as to surround said first recess;
   a metal electrode exposing step of reducing the thickness of said device forming area from the back side of said wafer to form a second recess on the back side of said wafer for exposing said metal electrodes from a bottom surface of said second recess; and
   a rewiring layer forming step of forming an insulating film on the bottom surface of said second recess except an exposed portion of each metal electrode and next forming said rewiring layer on said insulating film.

2. The wafer processing method according to claim 1, wherein said metal electrode exposing step is performed by etching.

* * * * *